United States Patent [19]
Henderson et al.

[11] Patent Number: 4,959,708
[45] Date of Patent: Sep. 25, 1990

[54] MOS INTEGRATED CIRCUIT WITH VERTICAL SHIELD

[75] Inventors: Mark F. Henderson, Kokomo; Thomas H. Manderfield, Greentown, both of Ind.

[73] Assignee: Delco Electronics Corporation, Kokomo, Ind.

[21] Appl. No.: 286,110

[22] Filed: Dec. 19, 1988

Related U.S. Application Data

[63] Continuation-in-part of Ser. No. 240,159, Aug. 26, 1988, abandoned.

[51] Int. Cl.[5] ............... H01L 29/06; H01L 27/02; H01L 27/10; H01L 23/48
[52] U.S. Cl. ........................... 357/84; 357/23.13; 357/40; 357/45; 357/71
[58] Field of Search .............. 357/23.13, 45, 40, 84, 357/71

[56] References Cited

U.S. PATENT DOCUMENTS

| | | | |
|---|---|---|---|
| 4,378,628 | 4/1983 | Levinstein et al. | 357/67 |
| 4,509,067 | 4/1985 | Minami et al. | 357/41 |
| 4,628,343 | 12/1986 | Komatsu | 357/84 |
| 4,724,471 | 2/1988 | Leuschner | 357/41 |
| 4,780,846 | 10/1988 | Tanabe et al. | 357/45 |
| 4,825,280 | 4/1989 | Chen et al. | 357/23.13 |

FOREIGN PATENT DOCUMENTS 58-53845  3/1983  Japan ..................... 357/84

Primary Examiner—J. Carroll
Attorney, Agent, or Firm—Robert M. Sigler

[57] ABSTRACT

A MOS integrated circuit in which a plurality of MOS devices on a substrate are interconnected with each other and with signal, power and ground pads in first and second electrical circuits adapted to process separate electrical signals. The pads are formed of first metal members below a passivation layer and second metal members in a second metallization layer projecting through openings in the passivation layer to contact the first metal members. A pair of adjacent signal carrying elements in the first and second electrical circuits subject to crosstalk through a horizontal parasitic capacitance of the passivation layer are shielded by a first metal member of the first metallization layer and a second metal member of the second metallization layer connected to the first metal member and extending through and above the passivation layer to block the capacitive coupling therethrough, the first and second metal members being grounded to the ground pad through the first metallization layer below the passivation layer or through the second metallization layer above the passivation layer.

5 Claims, 2 Drawing Sheets

MOS INTEGRATED CIRCUIT WITH VERTICAL SHIELD

BACKGROUND OF THE INVENTION

This application is a continuation-in-part of USSN 240,159, MOS Integrated Circuit With Vertical Shield, filed Aug. 26, 1988 and, assigned to the assignee of this invention, abandoned.

This invention relates to MOS integrated circuits, and particularly to such circuits covered by a dielectric passivation layer which can provide a capacitive parasitic communication path between signal carrying elements in separate signal processing circuits within the integrated circuit.

It sometimes occurs that, due to the constraints of circuit arrangements and space, signal carrying elements of two separate and desirably isolated circuits must be placed adjacent each other and in contact with the passivation layer of the integrated circuit. In this situation, the dielectric passivation layer can provide a horizontal parasitic capacitive coupling between the signal carrying elements that allows crosstalk between the circuits of high frequency elements in one of the signals. If one of the signal carrying elements cannot be moved to a different location on the chip, it would be desirable to provide a grounded shield between the elements to prevent such horizontal coupling. Shielding devices in the prior art, however, have either been of little effectiveness in providing shielding in a horizontal direction or have required extra steps and therefore extra expense in the fabrication process.

SUMMARY OF THE INVENTION

The circuit of this invention provides a vertical shield between signal carrying elements in an MOS integrated circuit in a manner believed to be previously unknown in the prior art. The shield provided is a complete shield that effectively prevents horizontal coupling and does not require an extra step in the fabrication process, since the shield is an addition to a second metallization layer already used to form part of the power, ground and signal connection pads of the integrated circuit. The shielding is therefore obtained essentially free, with just a modification to the appropriate mask to produce a vertical via through the passivation layer just above a metal member of a first metallization layer on the substrate between the signal carrying elements, with which metal member it is connected to form a vertical shield through the passivation layer between the signal carrying elements. The vertical via is grounded to the chip ground, either through a ground path of the first metallization layer or a ground line in the second metallization layer from the upper portion of the ground pad across the top of the passivation layer to the vertical via. The vertical via formed in the second metallization layer extends vertically above the top of the passivation layer, regardless of whether an above passivation ground line exists, to more completely block capacitive coupling over the top of the vertical shield.

It is not advisable to have signal carrying lines above the passivation layer, since they provide a path for circuit damaging ions from the outside environment to enter the circuit with current flow therethrough. However, if an above passivation ground line is provided in the second metallization layer, it is not otherwise connected in the circuit and therefore does not conduct any circuit signals during normal circuit operation and will thus allow few damaging ions entry to the circuit.

In particular, the invention comprises a MOS integrated circuit in which a plurality of MOS devices on a substrate are interconnected with each other and with signal, power and ground pads in first and second electric circuits adapted to process separate electric signals with a predetermined electric voltage applied across the power and ground pads and in which a dielectric passivation layer covers the integrated circuit to prevent the entry of ions from the external environment. The first and second electric circuits have signal carrying elements adjacent each other and the passivation layer such that high frequency signals tend to be coupled horizontally between the signal carrying elements through the passivation layer. The MOS integrated circuit has a first metallization layer under the passivation layer including first portions of the signal, power and ground pads, ground lines from selected ones of the MOS devices to the first portion of the ground pad and a first metal member on the substrate between the signal carrying elements but electrically unconnected therefrom.

The MOS integrated circuit further has a second metallization layer above the passivation layer comprising second portions of the signal, power and ground pads connected to the respective first portions thereof through openings in the passivation layer and a second metal member connected downward through another opening in the passivation layer between the signal carrying elements to the first metal member and extending above the passivation layer to prevent the horizontal capacitive coupling of the signal carrying elements through the passivation layer.

The MOS integrated circuit further has electrical ground connection means in one of the first and second metallization layers connecting the first and second metal members to the ground pad, whereby the first and second metal members comprise a grounded vertical shield between the signal carrying elements to prevent communication of signals therebetween. If the electrical ground connection means is a metal member of the second metallization layer extending over the passivation layer, it is isolated from any normally signal carrying devices so as to not encourage the entry of ions through the other opening in the passivation layer from the external environment.

Further details and advantages of the invention will be apparent from the accompanying drawings and following description of a preferred embodiment.

DESCRIPTION OF THE PREFERRED EMBODIMENT

Figure 1A:
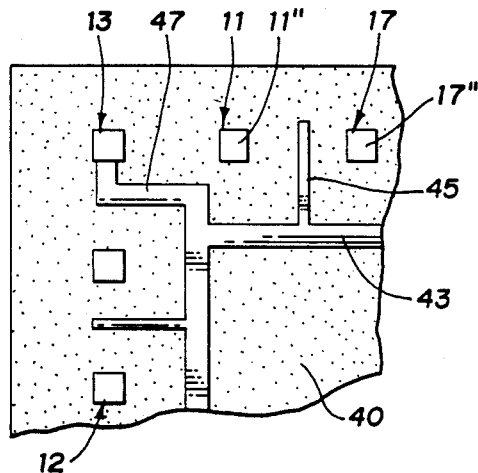
FIGS. 1a, 1b, and 1c are top views of three levels of a portion of an integrated circuit according to the invention showing the construction of the pads and their connection to the circuit elements.
Figure 1B:
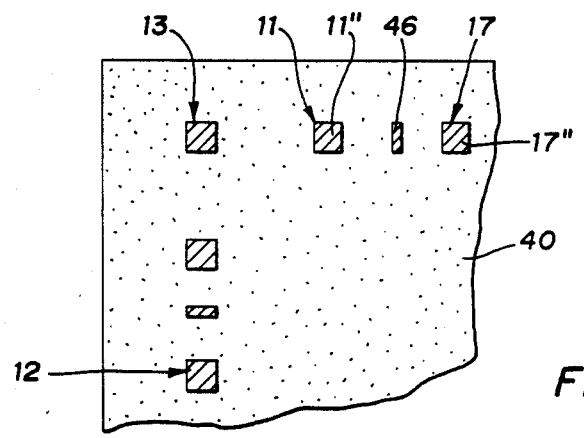
Figure 1C:
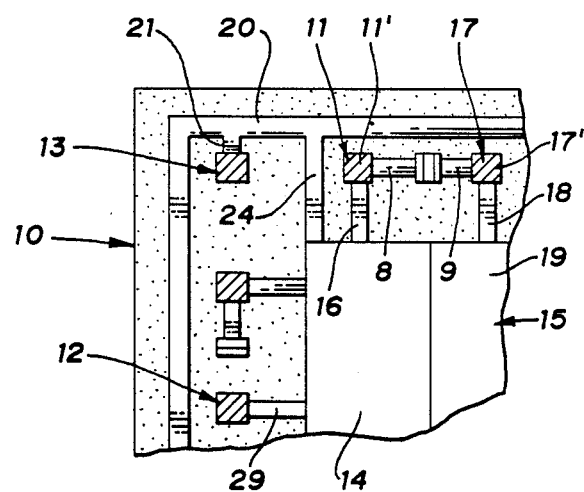

FIG. 1c shows a portion of an MOS integrated circuit which comprises a substrate 10 with a plurality of MOS devices connected in a circuit connected to a signal pad 11 and adapted to process an electrical signal when a predetermined voltage is applied across a power pad 12 and ground pad 13. The MOS devices are shown as a single block 15 because their exact natures and interconnections are unimportant to the invention, except that, in this embodiment they are grouped in at least two subcircuits isolated from each other on substrate 10. Subcircuit 14 includes devices connected to signal pad 11 by a metal runner 16; and subcircuit 19 includes devices connected to a signal pad 17 by a metal runner 18. The relevant characteristics of the subcircuits and their connections will be further described at a later point.

Selected ones of the MOS devices in both subcircuits 14 and 19 of block 15 are connected to a ground ring 20 which surrounds the circuit on substrate 10. Ground ring 20 is shown symbolically connected to subcircuit 14 of block 15 by a runner 24 and further connected by a runner 21 to ground pad 13. Selected ones of the MOS devices in both subcircuits 14 and 19 of block 15 are also connected, such as through a runner 29, to power pad 12, which provides, relative to ground pad 13, the predetermined operating voltage for the circuit: typically 6 volts.

The view of FIG. 1c described so far is actually a downward view of a first metallization layer of the circuit, which is located vertically above the substrate and at least one oxide layer 33 and is covered by a passivation layer 40. The metal runners and portions of the pads seen are part of the first metallization layer, which is deposited in a single step of the integrated circuit manufacturing process by means of an appropriate mask.

Figure 2:
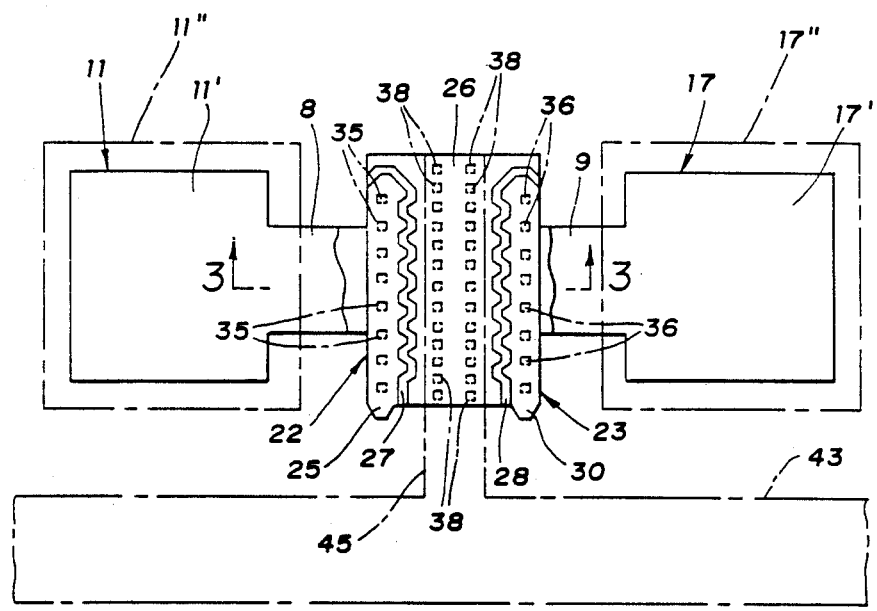
FIG. 2 is a view of a pair of ESD (electrostatic discharge) protection transistors associated with a pair of adjacent signal pads.
Figure 3:
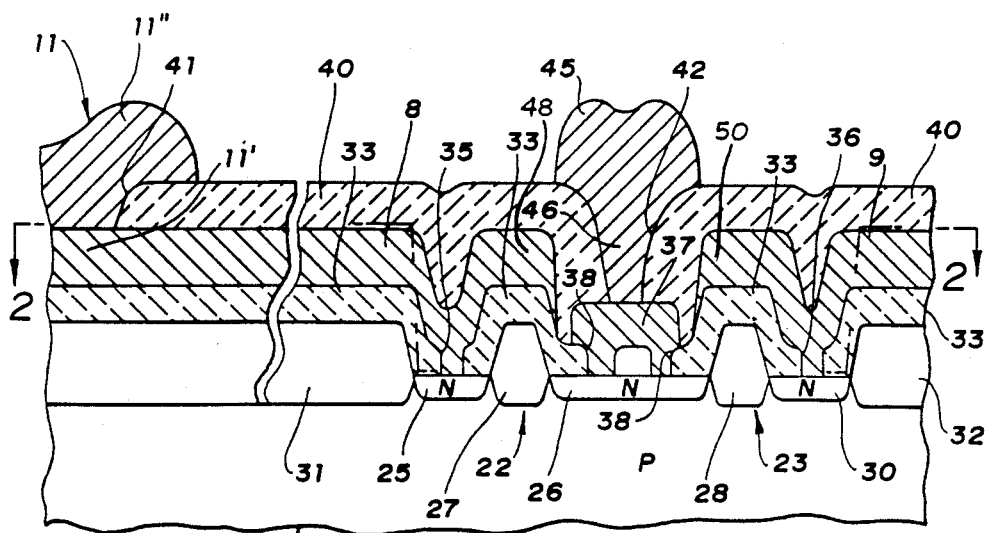
FIG. 3 is a cutaway view along lines 3—3 in FIG. 2.

The circuit of the invention is provided with one or more ESD protection devices which, in this embodiment, are shown as transistors. A pair of ESD protection transistors associated with signal pads 11 and 17 are identified as transistors 22 and 23 and are shown more clearly in an enlarged view in FIG. 2 and the section view of FIG. 3. Transistor 22 comprises a drain region 25 of n-type conductivity formed in substrate 10, which, at least in the region of transistor 22 has p-type conductivity. A source region 26 of n-type conductivity is also formed in substrate 10 and separated from drain region 25 by a gate region 27 of field oxide. In this embodiment, source region 26 is shared with transistor 23, which includes a drain region 30 of n-type conductivity in substrate 10 separated from source 26 by a gate region 28 of field oxide. Gate regions 27 and 28 of transistors 22 and 23 are laid out on opposite sides of source region 26 as shown in FIGS. 2 and 3. Additional regions 31 and 32 of field oxide overlay substrate 10 to the left of drain region 25 and to the right of drain region 30, respectively, in FIG. 3.

A contact oxide layer 33 overlays portions 25-32 of the chip described above. Above contact oxide layer 33 is a first metallization layer which includes a plurality of separate metal runners and members which are deposited simultaneously in chip manufacturing with an appropriate mask. This layer includes a lower or first portion 11, of signal pad 11 and a similar lower or first portion 17', shown in FIG. 1c, of signal pad 17, as well as metal runners 16 and 18 already described, but not shown in these Figures. As seen in FIG. 3, first portion 11, of pad 11 is connected to a metal runner 8, also a part of the first metallization layer, which extends over the edge of field oxide region 31 and downward through a series of openings 35 in contact oxide layer 33 to electrically connect with drain region 25, and further extends over gate region 27. Similarly, first portion 17, of pad 17 connects with a runner 9 in the first metallization layer which extends over the edge of field oxide region 32 and downward through a series of openings 36 in contact oxide layer 33 to electrically connect with drain region 30 and further extends over gate region 28. Another metal member 37 of the first metallization layer connects through the row of paired openings 38 in contact oxide layer 33 to source region 26 but is not connected to members 11,, 17,, 8 or 9.. Since there is no field oxide under metal member 37, it is seen to be somewhat lower than the adjacent ends of first portions 11' and 17' of pads 11 and 17. The significance of this will be apparent at a later point in this description.

A passivation layer 40 of a passivating material such as plasma nitride covers the entire chip, except as otherwise described, to protect the chip circuitry from damage due to free ions that might migrate into the chip from the external environment. Such ions are found, for example, as impurities in the potting material used to encapsulate the chip. Oxidizing ions such as chlorine ions are especially troublesome and plentiful. Any opening in the passivation layer allows the introduction of such ions into the chip. Any current or signal carrying member is especially vulnerable, since the ions appear to migrate along the member into the chip while current is flowing. The only exceptions to the passivation covering are generally the external connection pads such as signal pads 11 and 17 which must allow signal connection to the external world. The upper or second portions 11,, and 17,, of pads 11 and 17 are deposited on first portions 11, and 17', respectively, as part of a second metallization layer above passivation layer 40, through openings in passivation layer 40 such as opening 41 for pad 11 as shown, and overlap passivation layer 40 around their edges. To prevent damage from ions migrating in around the pads such as pads 11 and 17, all such pads are spaced far from the chip circuitry in a ring around the outside of the chip, with a predetermined setback from any active MOS device in the signal processing circuit.

To provide a ground path from drain region 26 of the ESD protection transistors, an opening 42 is provided through passivation layer 40 directly over metal member 37. The second metallization layer applied over passivation layer 40 includes a metal runner 43, as seen in FIG. 1a, a portion 45 of which extends to the opening 42 and forms a via 46 downward through opening 42 to electrically connect with metal member 37. Another portion 47 of metal runner 43 connects with ground pad 13 above passivation layer 40. Metal runner 43 and the second portions 11" and 17" of signal pads 11 and 17 are part of the same second metallization layer which is deposited in a mask step after the formation of passivation layer 40. Metal runner 43 is thus made of the same metal as that used to form the upper or contact areas of the pads. Since the second metallization layer is formed over the passivation layer, the metal may be formed into runners of much greater thickness than those in the first metallization layer under the passivation layer. In addition, the second metallization layer is closer to the outer environment and thus dissipates heat faster. Both of these facts provide a higher current carrying capacity for this ground path from the ESD transistors than from a first metallization path through ground ring 20 under passivation layer 40. As already mentioned, there is ordinarily no current through via 46 and therefore little migration of ions into the circuit through opening 42 in passivation layer 40.

There is an additional benefit in the embodiment shown. Due to the construction of transistors 22 and 23, the regions of runners 8 and 9 over gate regions 27 and 28, respectively, are much higher than the intervening metal member 37 of the same first metallization layer. It has already been mentioned that each of transistors 22 and 23 is connected, through runners 8 and 9, pads 11 and 17, and runners 16 and 18, respectively, to otherwise isolated subcircuits 14 and 19. Thus, a direct horizontal parasitic capacitive path would exist through passivation layer 40 over the top of metal member 37 except for via 46, which extends laterally substantially across the width of signal carrying elements 8 and 9 as shown in FIG. 2. Via 46 forms a vertical, grounded signal barrier blocking communication of high frequency signals from the adjacent ends 48 and 50 of runners 8 and 9, respectively, through the capacitance of passivation layer 40. Digital clock signals or other rectangular waves, for example, have leading and trailing edges which contain a large high frequency content which could easily be transmitted through the passivation layer directly over the top of metal member 37 without via 46 to serve as a vertical shield. Without this method of grounding the ESD transistors 11 and 17, they could not be located so close to each other.

Other embodiments of this invention are possible. In particular, the elements to be isolated may be circuit elements, other than ESD transistors, in which the large current capacity and heat dissipation characteristics of metal runner 43 are not needed. In this case, metal runner 43 may be eliminated and via 46 and member 37 grounded through metal members of the first metallization, not shown, under the passivation layer. However, via 46 still extends through the passivation layer 40 and projects above it to effectively prevent capacitive coupling through passivation layer 40 above via 46.

The embodiments of the invention in which an exclusive property or privilege is claimed are defined as follows:

1. A MOS integrated circuit in which a plurality of MOS devices on a substrate are interconnected with each other and with signal, power and ground pads in first and second electric circuits adapted to process separate electric signals with a predetermined electric voltage applied across the power and ground pads and in which a dielectric passivation layer covers the integrated circuit to prevent the entry of ions from the external environment, the first and second electric circuits having signal carrying elements adjacent each other and the passivation layer such that high frequency signals tend to be coupled horizontally between the signal carrying elements through the passivation layer;

the MOS integrated circuit having a first metallization layer under the passivation layer including first portions of the signal, power and ground pads, ground lines from selected ones of the MOS devices to the first portion of the ground pad and a first metal member on the substrate between the signal carrying elements but electrically unconnected therefrom;

the MOS integrated circuit further having a second metallization layer above the passivation layer comprising second portions of the signal, power and ground pads connected to the respective first portions thereof through openings in the passivation layer and a second metal member extending downward through another opening in the passivation layer between the signal carrying elements to the first metal member and extending above the passivation layer and laterally substantially across the width of the signal carrying elements to prevent the horizontal capacitive coupling of the signal carrying elements through the passivation layer;

the MOS integrated circuit further having electrical ground connection means in one of the first and second metallization layers connecting the first and second metal members to the ground pad, whereby the first and second metal members comprise a grounded vertical shield between the signal carrying elements to prevent communication of signals therebetween.

2. The MOS integrated circuit of claim 1 in which the electrical ground connection means comprises another metal member of the second metallization layer extending over the passivation layer and connecting the second metal member to the second portion of the ground pad, the other metal member being isolated from any normally signal carrying devices so as to not encourage the entry of ions through the other opening in the passivation layer from the external environment.

3. The MOS integrated circuit of claim 1 in which the signal carrying elements of the first and second electric circuits are third and fourth metal members of the first metallization layer overlaying portions of MOS devices located adjacent each other on the substrate with the first metal member therebetween so that the third and fourth metal members both extend farther up from the substrate than the first metal member and a resulting direct horizontal capacitive path between said third and fourth metal members through the passivation layer over the first metal member is blocked by the second metal member.

4. The MOS integrated circuit of claim 2 in which the signal carrying elements of the first and second electric circuits are third and fourth metal members of the first metallization layer overlaying portions of MOS devices located adjacent each other on the substrate with the first metal member therebetween so that the third and fourth metal members are both farther up from the substrate than the top of the first metal member and a resulting direct horizontal capacitive path between said third and fourth metal members through the passivation layer over the top of the first metal member is blocked by the second metal member.

5. The MOS integrated circuit of claim 4 in which the MOS devices located adjacent each other are ESD protection transistors sharing a common source over which the first metal member is located and the third and fourth metal members overlay gate regions of the ESD protection transistors and are connected to signal pads associated with the first and second electric circuits, respectively, the first and second metal members further providing an ESD discharge path to the ground pad when the ESD transistors conduct.

* * * * *